(12) United States Patent
Radke (10) Patent No.: US 9,442,796 B2
(45) Date of Patent: Sep. 13, 2016

(54) MEMORY CONTROLLER SUPPORTING RATE-COMPATIBLE PUNCTURED CODES

(71) Applicant: MICRON TECHNOLOGY, INC., Boise, ID (US)

(72) Inventor: William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/629,228

(22) Filed: Feb. 23, 2015

(65) Prior Publication Data

US 2015/0234704 A1    Aug. 20, 2015

Related U.S. Application Data

(60) Continuation of application No. 13/680,908, filed on Nov. 19, 2012, now Pat. No. 8,966,352, which is a division of application No. 11/943,943, filed on Nov. 21, 2007, now Pat. No. 8,327,245.

(51) Int. Cl.
*H03M 13/00* (2006.01)
*G06F 11/10* (2006.01)
*G11C 29/52* (2006.01)
(Continued)

(52) U.S. Cl.
CPC ........... *G06F 11/1068* (2013.01); *G11C 29/52* (2013.01); *H03M 13/005* (2013.01); *H03M 13/235* (2013.01); *H03M 13/353* (2013.01)

(58) Field of Classification Search
CPC ................... H03M 13/6375; H03M 13/6362; H03M 13/2933; G06F 11/1068

USPC .................................................. 714/790, 786
See application file for complete search history.

(56) References Cited

U.S. PATENT DOCUMENTS

| 4,112,502 A | 9/1978 | Scheuneman |
|---|---|---|
| 5,942,004 A | 8/1999 | Cappelletti |

(Continued)

FOREIGN PATENT DOCUMENTS

| EP | 797307 A2 | 9/1997 |
|---|---|---|
| JP | 9-261081 | 10/1997 |

(Continued)

OTHER PUBLICATIONS

Chinese Patent Office; Office Action dated Oct. 12, 2012, from related Chinese Patent Application No. 200880117049.8.

(Continued)

*Primary Examiner* — Cynthia Britt
(74) *Attorney, Agent, or Firm* — Brooks, Cameron & Huebsch, PLLC (57) ABSTRACT

Apparatus and methods store data in a non-volatile solid state memory device according to a rate-compatible code, such as a rate-compatible convolutional code (RPCC). An example of such a memory device is a flash memory device. Data can initially be block encoded for error correction and detection. The block-coded data can be further convolutionally encoded. Convolutional-coded data can be punctured and stored in the memory device. The puncturing decreases the amount of memory used to store the data. Depending on conditions, the amount of puncturing can vary from no puncturing to a relatively high amount of puncturing to vary the amount of additional error correction provided and memory used. The punctured data can be decoded when data is to be read from the memory device.

17 Claims, 4 Drawing Sheets

(51) Int. Cl.
*H03M 13/23* (2006.01)
*H03M 13/35* (2006.01)

(56) References Cited

U.S. PATENT DOCUMENTS

| | | | |
|---|---|---|---|
| 5,956,743 | A | 9/1999 | Bruce et al. |
| 6,279,133 | B1 | 8/2001 | Vafai |
| 6,591,394 | B2 | 7/2003 | Lee et al. |
| 6,628,723 | B1 | 9/2003 | Gerlach et al. |
| 6,628,732 | B1* | 9/2003 | Takaki ............ H04W 52/225 370/342 |
| 6,684,366 | B1 | 1/2004 | Trott et al. |
| 6,731,538 | B2 | 5/2004 | Noda |
| 6,751,772 | B1* | 6/2004 | Kim ............ H03M 13/2957 714/755 |
| 6,839,870 | B2 | 1/2005 | Fanfelle |
| 6,871,303 | B2 | 3/2005 | Halter |
| 7,020,073 | B2 | 3/2006 | Kadous et al. |
| 7,061,804 | B2 | 6/2006 | Chun et al. |
| 7,184,356 | B2 | 2/2007 | Noguchi et al. |
| 7,260,764 | B2 | 8/2007 | Chen |
| 7,389,465 | B2 | 6/2008 | Radke |
| 7,451,383 | B2 | 11/2008 | Kim et al. |
| 7,581,159 | B2 | 8/2009 | Hocevar |
| 7,643,342 | B2 | 1/2010 | Litsyn et al. |
| 7,689,892 | B2 | 3/2010 | Stolpman et al. |
| 7,844,879 | B2 | 11/2010 | Ramamoorthy et al. |
| 7,860,200 | B2 | 12/2010 | Furman et al. |
| 7,904,780 | B2 | 3/2011 | Brandman |
| 8,024,644 | B2 | 9/2011 | Shen |
| 8,060,796 | B2 | 11/2011 | Wang et al. |
| 8,291,279 | B2 | 10/2012 | Sharon et al. |
| 2003/0088821 | A1 | 5/2003 | Yokokawa et al. |
| 2003/0112879 | A1 | 6/2003 | Antia et al. |
| 2003/0126545 | A1* | 7/2003 | Tan ............ H04B 1/707 714/786 |
| 2003/0156454 | A1 | 8/2003 | Wei et al. |
| 2004/0022087 | A1 | 2/2004 | Satori |
| 2004/0268065 | A1 | 12/2004 | Hilton et al. |
| 2006/0123277 | A1* | 6/2006 | Hocevar ............ H03M 13/116 714/704 |
| 2006/0221752 | A1 | 10/2006 | Fasoli et al. |
| 2007/0061689 | A1 | 3/2007 | Park et al. |
| 2007/0124647 | A1 | 5/2007 | Chen et al. |
| 2007/0171714 | A1 | 7/2007 | Wu et al. |
| 2007/0171730 | A1 | 7/2007 | Ramamoorthy et al. |
| 2007/0266295 | A1 | 11/2007 | Conley |
| 2007/0300130 | A1* | 12/2007 | Gorobets ............ G06F 11/1068 714/766 |
| 2008/0002468 | A1* | 1/2008 | Hemink ............ G06F 11/1068 365/185.17 |
| 2008/0010582 | A1 | 1/2008 | Nieto et al. |
| 2008/0034272 | A1 | 2/2008 | Wu et al. |
| 2008/0137414 | A1 | 6/2008 | Park et al. |
| 2008/0168319 | A1 | 7/2008 | Lee et al. |
| 2008/0222490 | A1* | 9/2008 | Leung ............ G06F 11/1068 714/763 |
| 2008/0294960 | A1 | 11/2008 | Sharon et al. |
| 2008/0320361 | A1 | 12/2008 | Fukuda et al. |
| 2008/0320373 | A1 | 12/2008 | Kim et al. |
| 2009/0013233 | A1 | 1/2009 | Radke |
| 2009/0013234 | A1 | 1/2009 | Radke |
| 2010/0199153 | A1 | 8/2010 | Okamura et al. |
| 2010/0211724 | A1 | 8/2010 | Weingarten |
| 2011/0060969 | A1 | 3/2011 | Ramamoorthy et al. |

FOREIGN PATENT DOCUMENTS

| | | |
|---|---|---|
| JP | 2000-68862 | 3/2000 |
| JP | 2000149592 | 5/2000 |
| JP | 2004-071012 | 3/2004 |
| KR | 100766042 | 10/2007 |
| WO | WO 2004062113 | 7/2004 |
| WO | WO 2006070668 | 7/2006 |
| WO | WO 2006/135937 | 12/2006 |
| WO | WO 2007/084749 | 7/2007 |
| WO | WO 2007/084751 | 7/2007 |
| WO | WO 2008/069385 | 6/2008 |
| WO | WO 2008/078866 | 7/2008 |

OTHER PUBLICATIONS

Daneshgaran, et al.; An Extensive Search for Good Punctured Rate-k/(k+1) Recursive Convolutional Codes for Serially Concatenated Convolutional Codes; Information Theory, IEEE Transactions on, vol. 50, No. 1, pp. 208-217, Jan. 2004.
European Patent Office; Extended European Search Report of Related European Application, Application No. 08851231.4; Mailing date Jan. 30, 2012.
European Patent Office; Extended European Search Report of related European Application, Application No. 08852229.7; Report issue date Nov. 22, 2011.
Frenger, et al; Rate-Compatible Convolutional Codes for Multirate DS-CDMA Systems; Communications, IEEE Transactions on, vol. 47, No. 6, pp. 828-836, Jun. 1999.
International search report mailed Dec. 29, 2008 in PCT Application No. PCT/US2008/068240.
International search report mailed Jan. 20, 2009 in PCT Application No. PCT/US2008/068236.
Japanese Patent Office; Decision of Rejection dated Oct. 8, 2013, from related Japanese Application No. 2010-534994.
Japanese Patent Office; Decision of Rejection dated Oct. 8, 2013, from related Japanese Application No. 2010-534993.
Japanese Patent Office; Office Action dated Jun. 11, 2013, from related application Japanese Patent Application No. 2010-534994.
Japanese Patent Office; Office Action dated Jun. 11, 2013, from related application Japanese Patent Application No. 2010-534993.
Korean Intellectual Property Office; "Notification of Transmittal of the International Search Report and the Written Opinion of the International Searching Authority, or the Declaration", "Written Opinion of the International Searching Authority", and "International search report" of related International Application PCT/US2008/081743, filed Oct. 28, 2008; Dated Feb. 19, 2009; Daejeon, Republic of Korea.
Korean Intellectual Property Office; "Notification of Transmittal of the International Search Report and the Written Opinion of the International Searching Authority, or the Declaration", "Written Opinion of the International Searching Authority", and "International Search Report" of corresponding PCT application PCT/US/2008/081475, filed Oct. 28, 2008; mailed Feb. 18, 2009; Daejeon, Republic of Korea.
Korean Patent Office; Office action dated Oct. 30, 2014, from Related Korean Patent Application No. 10-2010-7013543 (filed Oct. 28, 2008).
Lee, P. J.; Constructions of Rate (N-1)/N Punctured Convolutional Codes With Mininmum Required SNR Criterion; Communications, IEEE Transactions on, vol. 36, No. 10, pp. 1171-1174, Oct. 1988.
Lin, et al.; A NAND Flash Memory Controller for SD/MMC Flash Memory Card; Electronics, Circuits and Systems; 2006; ICECS '06. 13th IEEE International Conference on, pp. 1284-1287, Dec. 10-13, 2006.
Ohtsuki, T.; Rate Adaptive Indoor Infrared Wireless Communication Systems Using Repeated and Punctured Convolutional Codes; Communications, 1999. ICC '99. 1999 IEEE International Conference on, vol. 1, pp. 609-613, 1999.
Sun, et al.; Design of On-Chip Error Correction Systems for Multilevel NOR and NAND Flash memories; Circuits, Devices & Systems, IET, vol. 1, No. 3, pp. 241-249, Jun. 2007.
Taiwanese Patent Office; Office action dated Jun. 20, 2014, from Related Taiwanese Patent Application No. TW 097143255 (filed Nov. 7, 2008).
Tang, et al; Viterbi Decoder for High-Speed Ultra-Wideband Communication Systems; Acoustics, Speech, and Signal Processing, 2005. Proceedings. (ICASSP '05); IEEE International Conference; vol. 5, pp. v/37, v/40, vol. 5; Mar. 18-23, 2005.

(56) References Cited

OTHER PUBLICATIONS

The International Bureau of WIPO; International Preliminary Report on Patentability of related PCT Application No. PCT/US2008/068236, filed Jun. 25, 2008; mailing date Jan. 21, 2010; Geneva, Switzerland.

The International Bureau of WIPO; International Preliminary Report on Patentability of related PCT Application No. PCT/US2008/068240, filed Jun. 25, 2008; mailing date Jan. 21, 2010; Geneva, Switzerland.

USPTO; Office Action dated Dec. 9, 2011, from related application U.S. Appl. No. 13/281,007, filed Oct. 25, 2011.

USPTO; Office Action dated Mar. 15, 2012, from related application U.S. Appl. No. 11/943,943, filed Nov. 21, 2011.

USPTO; Office Action dated Nov. 30, 2011, from related application U.S. Appl. No. 13/267,262, filed Oct. 6, 2011.

USPTO; Office Action dated Oct. 3, 2011, from related application U.S. Appl. No. 13/154,150, filed Jun. 6, 2011.

USPTO; Office Action dated Oct. 3, 2012, from related application U.S. Appl. No. 13/570,180, filed Aug. 8, 2012.

Ying, et al.; Seamless Data-Rate Change Using Punctured Convolutional Codes for Time-Varying Signal-to-Noise-Ratio; Communications, 1995. ICC '95 Seattle, 'Gateway to Globalization', 1995 IEEE International Conference on, vol. 1, pp. 342-346, Jun. 18-22, 1995.

Zhou, et al.; High Rate Turbo Code Using Unevenly Punctured Convolutional Constituent Code; Communications, 1999, APCC/OECC '99. Fifth Asia-Pacific Conference on . . . and Fourth Optoelectronics and Communications Conference, vol. 1, pp. 751-754, 1999.

USPTO; Office Action dated Aug. 28, 2013, from related application U.S. Appl. No. 13/680,908, filed Nov. 19, 2012.

USPTO; Office Action dated Jun. 6, 2014, from related application U.S. Appl. No. 13/680,908, filed Nov. 19, 2012.

Korean Patent Office; Office Action dated Oct. 19, 2015, from related Korean Patent Application No. 10-2010-7013543.

* cited by examiner

MEMORY CONTROLLER SUPPORTING RATE-COMPATIBLE PUNCTURED CODES

CROSS-REFERENCE TO RELATED APPLICATION

This application is a continuation application of U.S. application Ser. No. 13/680,908, filed Nov. 19, 2012, now U.S. Pat. No. 8,966,352, which is a divisional application of U.S. application Ser. No. 11/943,943, filed Nov. 21, 2007, now U.S. Pat. No. 8,327,245, the entireties of each of which are hereby incorporated by reference herein.

BACKGROUND

1. Field of the Invention

Embodiments of the invention generally relate to integrated circuits. In particular, embodiments of the invention relate to memory circuits.

2. Description of the Related Art

Flash memory is a form of erasable and reprogrammable non-volatile memory. In a flash memory, memory cells are arranged in "blocks" for erasure. After a block has been erased, it is ready for programming if desired. NOR flash memory is a type of flash memory that offers access to individual bytes for retrieval of data, but has relatively low density.

NAND flash memory is a type of flash memory that offers relatively high density. The high density is achieved in part by forming columns of cells connected in series. In addition, with NAND flash memory, data is programmed and accessed in relatively large groups of bytes, such as a page of data. For example, a page can correspond to a row or to a portion of a row in an array.

For example, a memory array of cells for storing data is typically arranged in a 2-dimensional array of rows and columns. These arrays can vary greatly in size. When the cells of the array are capable of holding 2 or more levels, that is, multiple levels or two or more bits of data per cell, the array effectively holds data in 3 dimensions.

In a typical array for NAND flash memory, sources and drains of flash cells are arranged in series (source to drain) and referred to as columns. Along rows are "word lines" that control the gates of cells. Data is typically accessed a row at a time, with one bit from each column. The word line for the row to be read is set to a particular voltage for reading the stored state(s) of the cells. Different voltage levels can be used for multiple-level cells. The other row lines for the other cells of the columns are set to turn "on" the cells to permit the reading of the stored state(s) of the cells of the row through the corresponding cells in the columns.

The number of bytes per row can vary in a very wide range, as can the number of bytes in a "page." Some manufacturers define a page by a certain amount of data, so that, for example, two pages of data can correspond to one word line (row). For the purposes of the present description, a "page" of data corresponds to the amount of data that is written to or read from the NAND flash memory array during a write cycle or read cycle. In one example, 2,112 bytes are retrieved by activation of a word line. Of these 2,112 bytes, 2,048 are data bytes and 64 are spare bytes, which are typically used for error correction codes (ECC), wear-leveling information, or other overhead data. Error correction codes increase the robustness of the stored data. Typically, a form of block code is used to generate the error correction codes, such as cyclic redundancy check (CRC) checksums, Reed-Solomon error correction, or the like. These error correction codes detect if there were errors in the reading of the data bytes and can typically correct errors in the data bytes provided that the errors do not exceed the capability of the error correction code.

Flash memory has many uses. Examples include flash memory hard drives (replacements for hard drives), USB flash drives or thumb drives, mobile phones, digital cameras, digital media players, games, memory cards, navigation devices, personal digital assistants, computers, or the like. Within limits, the error correction codes can correct many errors in the data in the data bytes. However, beyond these limits, data with errors cannot typically be corrected. For example, if a word line fails, then there can be problems reading data for the entire row. This typically results in too many errors for the error correction codes to correct. Depending on the criticality of the data, the effects of uncorrectable errors in data can range from inconvenient to catastrophic.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Data is stored in a non-volatile solid state memory device according to a rate-compatible code, such as a rate-compatible convolutional code (RCPC). An example of such a memory device is a flash memory device. Data can initially be block encoded, such as for error correction and detection. The block-encoded data is further convolutionally encoded. While convolutional encoding increases redundancy, it also increases the amount of data to be stored. When punctured (which is sometimes also referred to as "perforated"), some of the convolutionally-encoded data is removed according to a puncture pattern. Examples of puncture patterns will be described later in connection with FIG. 3. This increases the code rate m/n, where m is the number of information symbols and n is the number of code symbols, of a rate-compatible code. The puncturing decreases the amount of memory used to store the data. Depending on conditions, the amount of puncturing can vary from no puncturing to a relatively high amount of puncturing to vary the amount of additional error correction provided and memory used. The punctured encoded data is decoded when data is to be read from the memory device. Although particular embodiments are described herein, other embodiments, including embodiments that do not provide all of the benefits and features set forth herein, will be apparent to those of ordinary skill in the art.

There are two contexts in which the term "block" is used. With respect to NAND flash, a block is a collection of pages corresponding to an erasable unit of memory. With respect to error correction, block code refers to a type of error correction. The two can be distinguished based on context.

Figure 1:
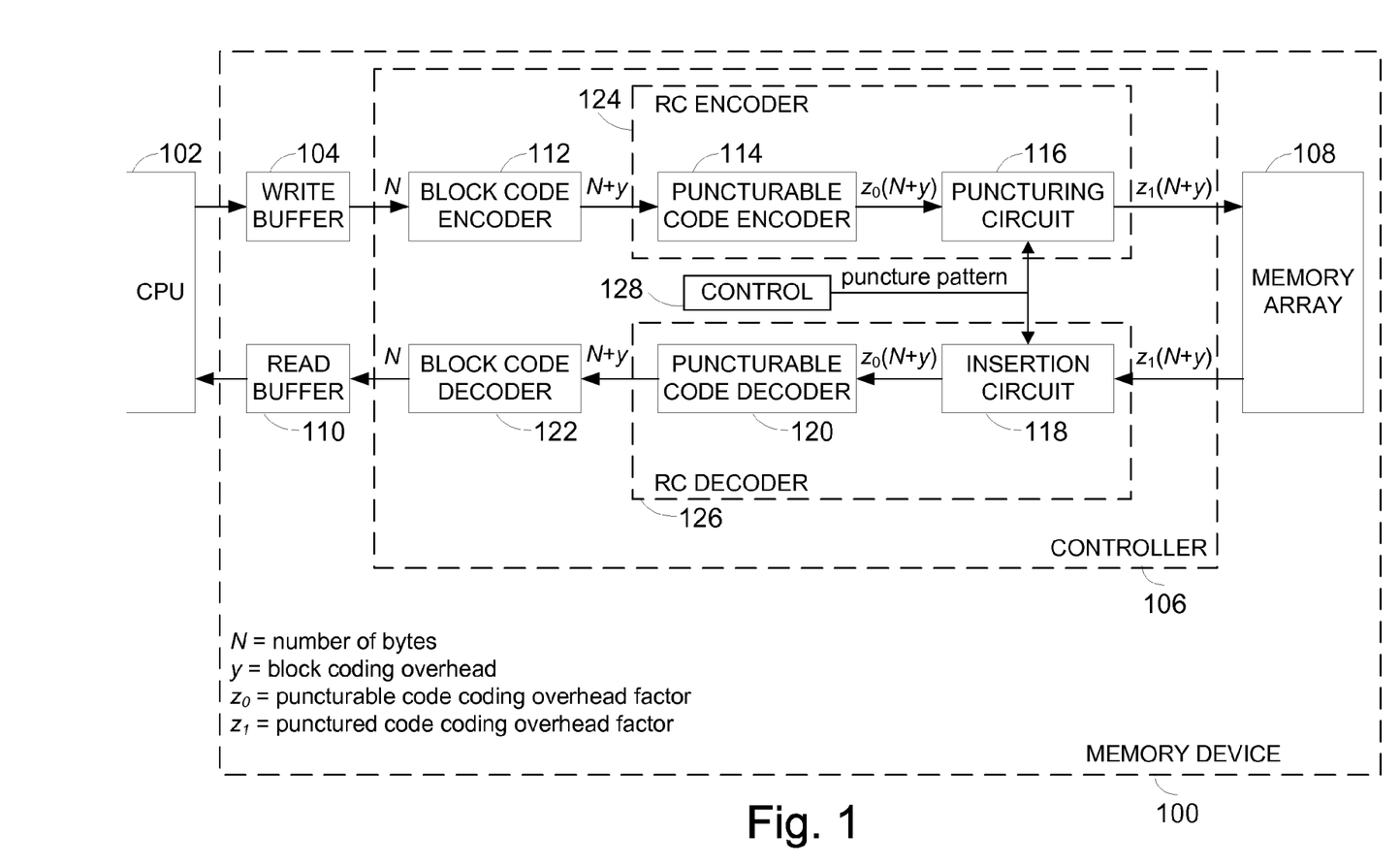
FIG. 1 is a schematic including a memory device, wherein the memory device stores data with an outer block code and an inner rate-compatible code.
Figure 2:
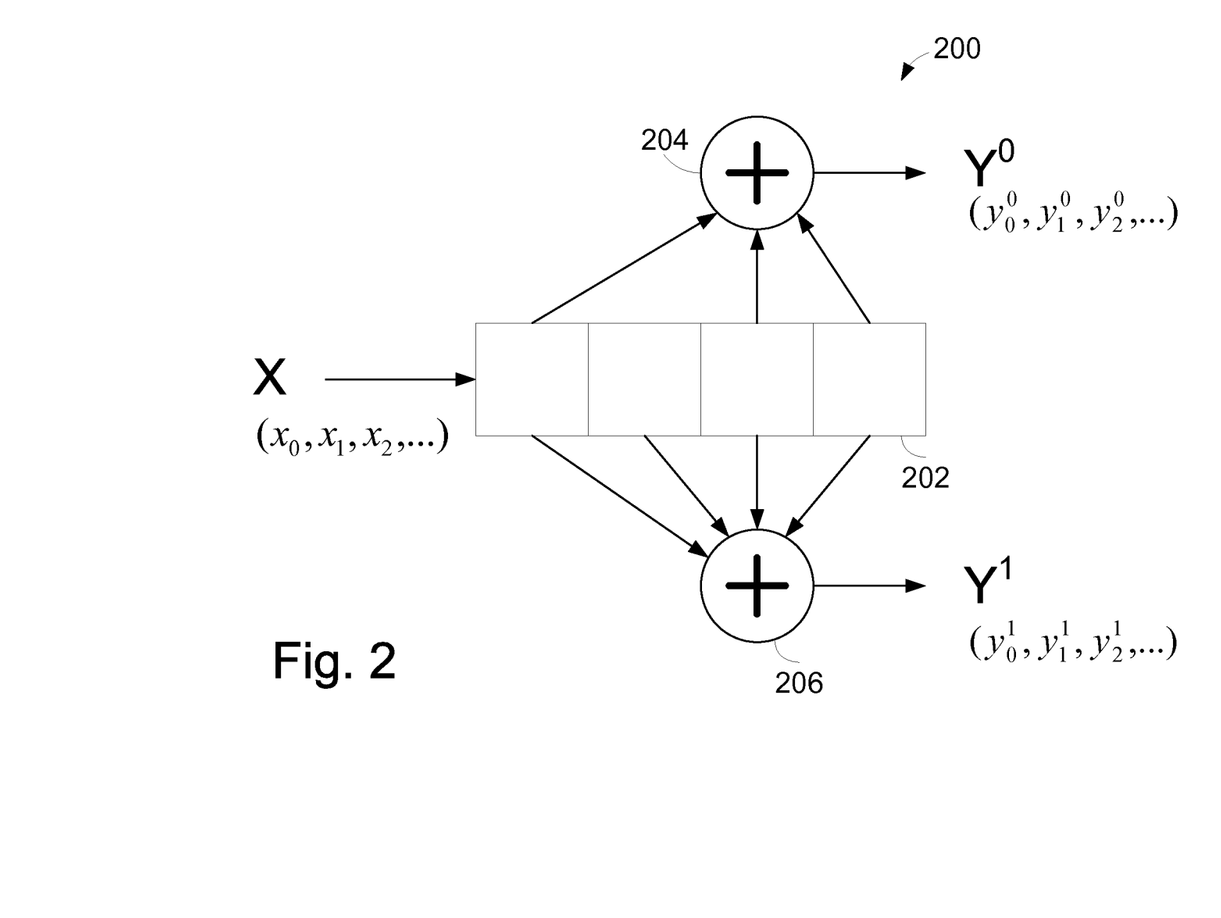
FIG. 2 schematically illustrates an example of a coder for generating a convolutional code.

FIG. 1 is a schematic including a memory device 100, wherein the memory device uses a rate-compatible code, i.e., a convolutional code with an adjustable code rate m/n to generate encoded data. An example of a rate-compatible code is a convolutional code. A convolutional code is a forward error correction technique in which an input data stream to a convolutional encoder is convolved with the encoder's impulse response. A block diagram of an example of a computation of a convolutional code is illustrated in FIG. 2. The illustrated embodiment generates a concatenated error correction code formed by an inner code and an outer code. The outer error correction code is generated first. The inner error correction code is encoded after the outer code is generated and further encodes the outer code. An outer block code provides error detection capability and error correction capability. The inner rate-compatible code provides additional error correction capability. In contrast to block codes that process data in blocks, the rate-compatible inner code processes the data in a continuous manner.

The memory device 100 is illustrated in communication with a CPU 102, which represents a device that uses the memory device 100. The CPU 102 is a processor that can correspond to a microprocessor, a microcontroller, a signal processor, or the like. The illustrated memory device 100 includes a write buffer 104, a controller 106, a memory array 108, and a read buffer 110.

The controller 106 further includes a block code encoder 112, a rate-compatible encoder 124, a rate-compatible decoder 126, and a block code decoder 122. In the illustrated embodiment, the rate-compatible encoder 124 further includes a puncturable code encoder 114 and a puncturing circuit 116, and the rate-compatible decoder 126 further includes an insertion circuit 118 and a puncturable code decoder 120. The controller 106 can be implemented by hardware, by firmware (software), or by a combination of both hardware and firmware. The block code encoder 112 and the puncturable code encoder 114 each provide forward error correction (FEC). The controller 106 handles data storage to and data retrieval from the memory array 108. For clarity, familiar components such as buffers, row decoders, sense/amplifier circuits and the like are not shown in FIG. 1. For example, there can be a buffer between the block code encoder 112 and the puncturable code encoder 114 for storage of the data to be encoded. There can be a buffer for storage of the data to be punctured between the puncturable code encoder 114 and the puncturing circuit 116. There can be a buffer for storage of the punctured encoded data to be written between the puncturing circuit 116 and drivers for the memory array 108.

In one embodiment, the memory array 108 corresponds to a NAND flash memory array. The NAND flash memory array can be of single level, multi-level, or can even correspond to multiple arrays. While particular embodiments will be described in the context of NAND flash memory, the principles and advantages described herein are applicable to other types of memories. A range of non-volatile solid state memory types can be used for the memory array 108. For example, the memory array 108 can correspond to other forms of flash (e.g., NOR type), electrically erasable programmable read only memory (EEPROM), magnetoresistive random access memory (MRAM), programmable conductor memory, ferroelectric memory, and the like.

The write buffer 104 stores data intended for storage to the memory array 108. The read buffer 110 stores data retrieved from the memory array 108 for reading by the CPU 102. For a NAND flash memory, a "page" of data is typically written to or read from the memory array 108 at a time. The size of this page of data can vary among memory devices. Typical page sizes include, but are not limited to, 512 bytes, 1024 bytes, 2048 bytes, and the like. In the schematic, a variable N represents the amount of data (e.g., number of bytes) for a page. While the particular page size is typically fixed in size from the vantage of the CPU 102, the page size stored in the memory array 108 will vary depending on the code rate as will be explained in greater detail in the following.

The N number of normal data bytes is encoded by the block code encoder 112. Examples of block codes include, but are not limited to, a Hamming code, a Reed-Solomon error correction code, a Bose-Chaudhuri-Hocquenghem (BCH) code, or the like. Within limits, these block error correction codes can be used to detect and correct many errors in the data. The data encoded using the block codes occupy additional bytes represented in FIG. 1 as variable y number of block code bytes. In a conventional NAND flash memory array, the block codes are typically stored in a spare bytes area for the corresponding page, which can include other information as well as the block codes. For the purposes of illustration, these possible extra bytes are included in the variable y. Accordingly, for a conventional NAND flash memory array, N+y bytes are stored for the page for N bytes of normal data and for y bytes of error correction data. Typically, for a block code, the N bytes of the N+y bytes remain the same data, and they block code bytes for error correction are appended to the N bytes of normal data. The N bytes of normal data can be considered the original data for the block code coder 112, and the N+y bytes can be considered the original data for the puncturable code coder 114. The block codes later permit errors to be detected and/or corrected when encoded data is decoded.

The rate-compatible encoder 124 encodes the block encoded data. In one embodiment, the rate-compatible encoder 124 includes the puncturable code encoder 114 and the puncturing circuit 116. The puncturable code encoder 114 encodes using an inner rate-compatible code, e.g., convolutional code, to encode the N+y bytes of data from the block code encoder 112. Typically, the code rate for the code before puncturing is 1/n, e.g., 1/2, 1/3, 1/4, etc. This encoding increases the amount of data for the page by a factor $z_0$, such that $z_0(N+y)$ bytes are generated at an output of the puncturable code encoder 114. For a code rate of 1/n, then $z_0$ is equal to n. For example, for a half-rate (½) code rate, $z_0$ is equal to 2. Generation of convolutionally encoded data with a half-rate code will be described in greater detail later in connection with FIG. 2.

The puncturing circuit 116 punctures the convolutionally encoded data. In one embodiment, the function of the puncturing circuit 116 is integrated with the puncturable code encoder 114. This decreases the amount of data, which increases the code rate (m/n). After puncturing, the number of bits for the page is $z_1(N+y)$ bytes, where $z_1$ is the inverse of the code rate after puncturing. The $z_1(N+y)$ bytes are stored in the memory array 108. With the growth in size of the data, memory addresses can also be mapped internally to the memory device to reflect the increase in the size of the data stored. An advantage of puncturing is that it can be used to vary the code rate (m/n), and hence, the amount of storage used versus the amount of redundancy stored.

Examples of punctured code rates include, but are not limited to 2/3 and 4/5 as will be described later in connection with FIG. 3. Other code rates are applicable and will be readily determined by one of ordinary skill in the art. The code rate (m/n) depends on the particular puncture pattern selected and the code rate of the code use to encode the data to be punctured. When data is "punctured," certain bits of the data are deleted. In FIG. 1, a puncture pattern or an indication for a puncture pattern is provided by a control circuit 128. The code rate (m/n) can vary with the puncture pattern, and the amount of space of the memory array 108 used to store the punctured data can then vary. Accordingly, it will be understood that mapping of addresses, rows and/or columns and indications of code rates used by particular blocks can be stored in a reference area of the memory array 108 and used and/or selected by the control circuit 128. In one embodiment, the control circuit 128 also stores reference information in the memory array 108 that indicates the puncturing level of the punctured data. For example, a puncture pattern can be stored. In one embodiment, the reference information is not itself punctured so that it can be decoded without knowledge of a puncture pattern. In one example, the reference information is stored at the end of each page. However, the reference information can also be stored at the end of each block, or within one block for the entire array, and the like. A further example of a possible function of the control circuit 128 will be described later in connection with FIG. 4.

The rate-compatible decoder 126 decodes the punctured data. The rate-compatible decoder 126 can also decode non-punctured data as applicable. In one embodiment, the rate-compatible decoder 126 includes the insertion circuit 118 and the puncturable code decoder 120. When $z_1(N+y)$ bytes of punctured data are retrieved from the memory array 108, the insertion circuit 118 uses the puncture pattern to insert dummy data, which, for example, does not affect the likelihood calculation (branch metrics) for a possible decoding sequence of a Viterbi decoder, to substitute for the data that was previously deleted (depuncture). In an alternative embodiment, rather than inserting dummy data, erasure pointers are used to indicate to the decoder that the particular data has been punctured. In one embodiment, the "insertion" function of the insertion circuit 118 is replaced by a hard-wired mathematical equivalent in the puncturable code decoder 120. There should be enough redundancy to correctly decode the punctured data provided that the total number of errors is within the error correcting capability of the rate-compatible code.

The reconstituted code with $z_0(N+y)$ bytes is decoded by the puncturable code decoder 120. In one embodiment, the puncturable code decoder 120 is a Viterbi decoder, which deconvolves convolutionally encoded data. The deconvolved data is then provided to the block code decoder 122 (e.g., for further error detection and/or correction). The block code decoder 122 decodes the $z(N+y)$ bytes of block-encoded data and generates N bytes of corrected data (unless the errors are uncorrectable). The N bytes of corrected data are placed in the read buffer 110 for access by the CPU 102.

At relatively low code rates, the concatenation of the outer block code and the inner convolutional code from the combination of the block code coder 112 and the rate compatible encoder 124 should improve the integrity of the stored data and increase the likelihood of recovering correctable data. The effect can be observed by a lowering of the bit error rate (BER). The improvement in BER can be used to allocate the available memory to encode more valuable data with more redundancy and less valuable data with less redundancy. For example, program data, such as firmware, operating system, or other program data, can be encoded with more redundancy than application data, such as a music file. In another example, to be described later in connection with FIG. 4, data destined for areas of the memory array 108 that have been identified as becoming less reliable can be concatenated with a relatively lower rate inner code. For example, the amount of puncturing can be reduced or the puncturing can be disabled altogether to increase the redundancy and the error correcting capability of the inner code.

FIG. 2 illustrates an example of an encoder 200 for convolutionally encoding data, which is an example of a rate-compatible encoder. The encoder 200 uses a convolutional code with an m/n code rate of 1/2. The encoder includes a shift register 202, a first modulo-2 adder 204, and a second modulo-2 adder 206. The modulo-2 adders 204, 206 implement exclusive-OR (XOR) logic. Input data bits X are provided serially to the shift register 202. The shift register 202 and the modulo-2 adders 204, 206 implement generator polynomials $Y^0$, $Y^1$, one each per modulo-2 adder 204, 206. The generator polynomials characterize the transfer function of the convolutional encoder. A wide range of generator polynomials can be used. In addition, more than 2 generator polynomials can be computed if desired, with a corresponding decrease in code rate, e.g., 1/3, 1/4, etc.

Figure 3:
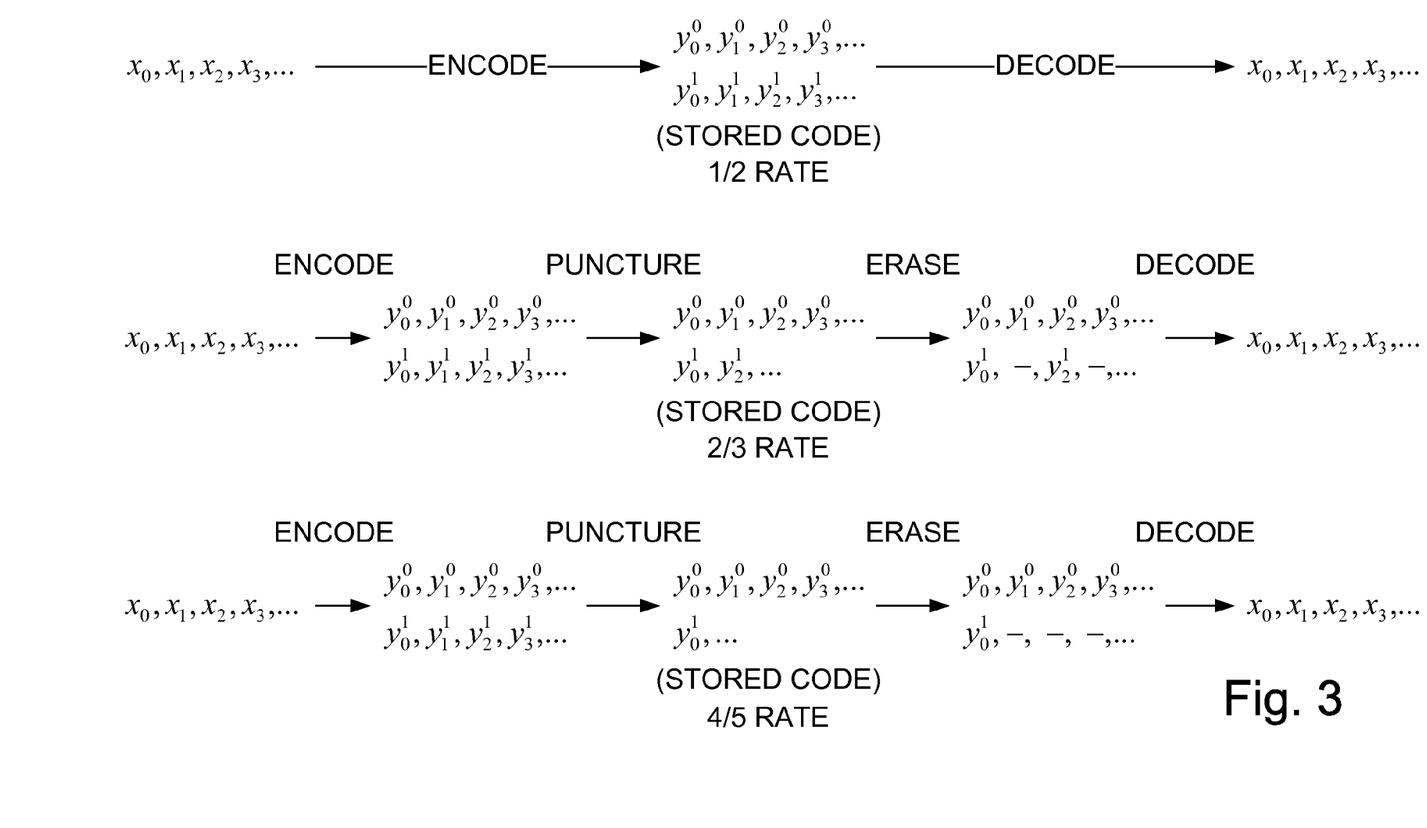
FIG. 3 schematically illustrates data flows for puncturing a convolutional code.

FIG. 3 illustrates data streams. For example, with reference to FIG. 1, the data streams can correspond to those occurring in a path around the puncturable code encoder 114, the puncturing circuit 116, storage in and retrieval from the memory array 108, the insertion circuit 118, and the puncturable code decoder 120. In a first example at the top, the data stream is convolutionally encoded using code rate of 1/2 and stored without puncturing. In a second example in the middle, the data stream is convolutionally encoded using a code rate of 1/2 and punctured to attain a code rate of 2/3. In a third example at the bottom, the data stream is convolutionally encoded using code rate of 1/2, and punctured to attain a code rate of 4/5.

Returning to the first example at the top, the data stream $x_0, x_1, x_2, x_3, \ldots$ from the output of the block code encoder 112 is convolutionally encoded to generate two output data streams $y_0^0, y_1^0, y_2^0, y_3^0,$ and $y_0^1, y_1^1, y_2^1, y_3^1, \ldots$. These two output data streams are stored in the memory array 108 without puncturing. When data is retrieved from the memory array 108, the puncturable code decoder 120 can decode the $y_0^0, y_1^0, y_2^0, y_3^0, \ldots$ and $y_0^1, y_1^1, y_2^1, y_3^1, \ldots$ data streams without insertion of any data.

In the second example in the middle, the data stream $x_0, x_1, x_2, x_3, \ldots$ is convolutionally encoded to generate two output data streams $y_0^0, y_1^0, y_2^0, y_3^0, \ldots$ and $y_0^1, y_1^1, y_2^1, y_3^1, \ldots$, which are then punctured to $y_0^0, y_1^0, y_2^0, y_3^0, \ldots$ and $y_0^1, y_2^1, \ldots$, which are stored in the memory array 108. For a data read, the punctured data $y_0^0, y_1^0, y_2^0, y_3^0, \ldots$ and $y_0^1, y_2^1, \ldots$ are retrieved from the memory array 108, dummy values that do not disturb decoding are inserted to replace the deleted data or erasure pointers are used, and the punctured data with insertions $y_0^0, y_1^0, y_2^0, y_3^0, \ldots$ and $y_0^1, -, y_2^1, -, \ldots$ are decoded by the puncturable code decoder 120 to decode back to the original data stream $x_0, x_1, x_2, x_3, \ldots$. The dash (-) indicates the data that has been erased.

In the third example at the bottom, the data stream $x_0, x_1, x_2, x_3, \ldots$ is convolutionally encoded to generate two output data streams $y_0^0, y_1^0, y_2^0, y_3^0, \ldots$ and $y_0^1, y_1^1, y_2^1, y_3^1, \ldots$, which are then punctured to $y_0^0, y_1^0, y_2^0, y_3^0, \ldots$ and $y_0^1, \ldots$, which are stored in the memory array 108. For a data read, the punctured data $y_0^0, y_1^0, y_2^0, y_3^0, \ldots$ and $y_0^1, \ldots$ are retrieved from the memory array 108, dummy values that do not disturb decoding are inserted to replace the deleted data or erasure pointers are used, and the punctured data with insertions $y_0^0, y_1^0, y_2^0, y_3^0, \ldots$ and $y_0^1$, -, -, -, . . . are decoded by the puncturable code decoder 120 to decode back to the original data stream $x_0$, $x_2$, $x_3$, . . . .

As illustrated in FIG. 3, the rate-compatible codes permit data to be stored in various densities by manipulating the code rate. Thus, a relatively low code rate can be used when relatively more redundancy is desired. This makes a tradeoff between storage capacity and reliability of storage possible after the memory device 100 (FIG. 1) has been placed into the field. Thus, for example, a user can select between more reliable data storage or more data storage. In another example, the constraint length k of a convolutional code used for the rate-compatible code can vary. The constraint length k refers to the length of the transfer function of the convolutional encoder. A tradeoff can be made between more reliable data storage and decoding complexity. Select portions of the chip can be pre-allocated to, for example, relatively high code rates or to relatively low code rates (and in between). In another example, program data for firmware, operating systems, and the like can be considered to be more valuable than application data, such as the data for music or a document. Frequently, the type of data being stored is identifiable by reading of a header. Accordingly, the more valuable data can be stored with the greater redundancy afforded by the lower rate code. The applicable mapping of pages, blocks, puncture patterns, and the like can be stored in a reference area of persistent memory, such as in a block of data that also stores bad block table data.

In another example, an convolutional code with an m/n code rate of 1/4 is generated. The convolutional code with the unpunctured code rate of 1/4 is used to store reference information. For the storage of other data, the convolutional code is punctured to a different code rate, such as 1/3 or 1/2. In one embodiment, the amount of puncturing is selectable as will be described later in connection with FIG. 4. In addition, the memory array 108 (FIG. 1) can have multiple-level cells, and the convolutionally coded data (punctured or unpunctured) can be spread among the multiple levels of the cells.

Figure 4:
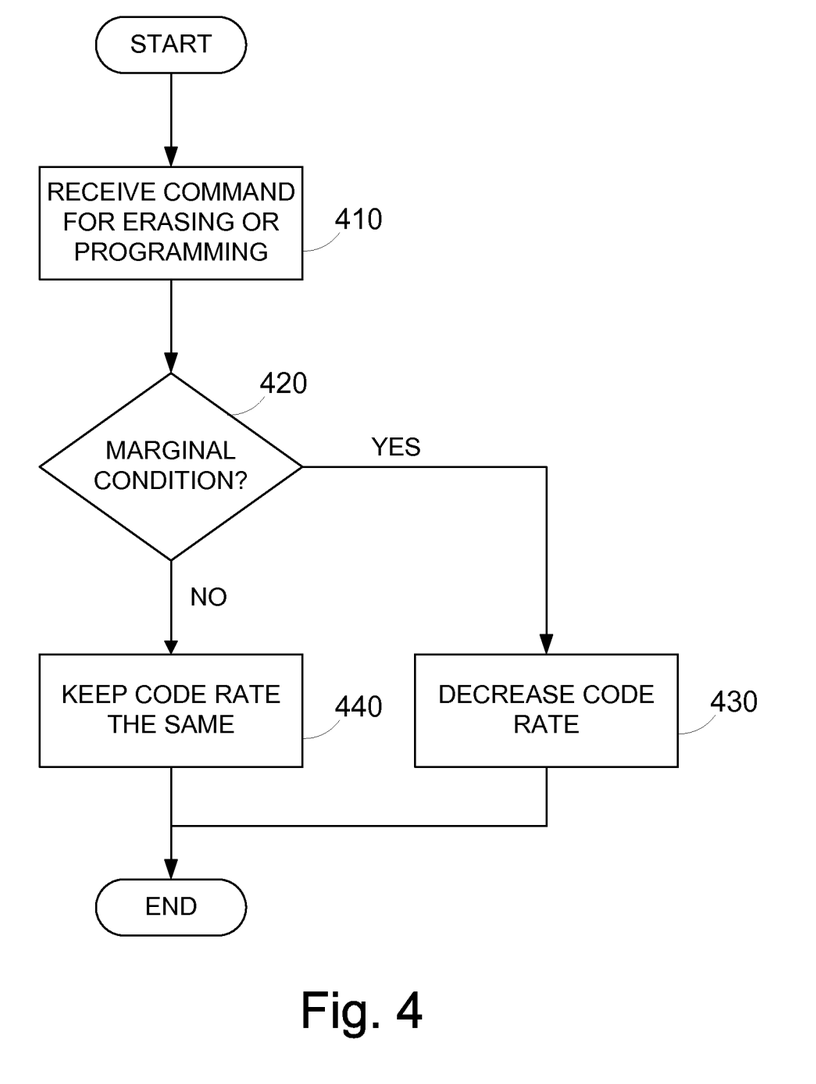
FIG. 4 is a flowchart generally illustrating a process for dynamically selecting a code rate for storage of data in a NAND flash memory device.

In one embodiment, code rates can also be varied after the memory device 100 (FIG. 1) is put into the field. However, it should be noted that the page size and the block size of the encoded data varies with the code rate, so that memory maps, indicators for starting or stopping addresses, indications of which puncture pattern is selected and so forth, should also be adjusted appropriately and persistently stored for retrieval. If constraint lengths and/or generator polynomials are varied, those can also be stored for later retrieval. Because the block will consume a varying amount of physical memory space depending on the code rate, the block can be allocated when it is erased. FIG. 4 illustrates an example of a dynamic selection of a code rate.

FIG. 4 is a flowchart generally illustrating a process for dynamically selecting a code rate for storage of data in a NAND flash memory device. It will be appreciated by the skilled practitioner that the illustrated process can be modified in a variety of ways without departing from the spirit and scope of the invention. For example, in another embodiment, various portions of the illustrated process can be combined, can be rearranged in an alternate sequence, can be removed, and the like. In one embodiment, the various blocks of the NAND flash memory device initially start with a relatively high code rate (low redundancy), and as wear out occurs, the code rate can be lowered for more redundancy.

In a NAND flash memory device, memory is erased in relatively large blocks of multiple pages, and data is typically written to and read from a page at a time. The process begins by receiving a command for erasing a block or programming 410 a portion of an erased block.

The process determines 420 whether there has been an indication of a marginal condition at the code rate being used for a particular block. A marginal condition can be indicated by an increase in the number of bits being corrected by block ECC. When, for example, block ECC indicates that it is within one bit of not being able to correct further errors, the page and/or block can be considered to be degraded and flagged for increased redundancy via less puncturing. This can postpone the retirement of a block and increase the service life of the memory device 100 (FIG. 1). There are other situations in which it may be desirable to select a code rate dynamically. Besides the examples mentioned earlier, a code rate can be selected depending on how much memory is available in the memory array 108 of the memory device 100. The process depicted in FIG. 4 is but one example.

Flash memory chips exhibit a wear out mechanism. For example, a memory device 100 (FIG. 1) can be initially configured during production to operate with a relatively high code rate, e.g., 4/5. As the memory device 100 wears out, the code rate can be decreased such that the memory device 100 retains reliability. It should be noted that this block ECC decoding is being performed during a read operation. In one embodiment, a block is read and block ECCs for the pages of the block are checked before the block is erased. In another embodiment, the pages of the block are read on an ongoing basis during normal read operations.

If the block ECC indicates a marginal condition, the code rate is decreased 430. This can be accomplished by reducing an amount of puncturing for the next set of data. For example, the code rate can be adjusted from 2/3 to 1/2 (no puncturing).

If the block ECC does not indicate a marginal condition, the process can proceed to keep 440 using the previous code rate for the next set of data to be programmed to those memory locations.

One embodiment is an apparatus including: an encoder configured to receive data, wherein the encoder is configured to puncture the received data; one or more memory arrays configured to store the punctured data; and a decoder configured to decode the punctured data.

One embodiment is a method for storing data in a non-volatile memory device having one or more memory arrays, wherein the method includes: receiving data intended for storage in the one or more memory arrays; encoding the data to generate punctured data; and storing the punctured data in the one or more memory arrays.

One embodiment is a method of retrieving punctured data stored in a non-volatile memory device having one or more memory arrays, wherein the method includes: retrieving the punctured data from the one or more memory arrays of the memory device; and decoding the punctured data according to a puncture pattern associated with the punctured data.

One embodiment is a method of determining a code rate for a block of memory space in a non-volatile solid-state memory device, wherein the method includes: determining whether a marginal condition exists for at least a portion of a block of data of the memory device; and decreasing a code rate used with the block if the marginal condition exists.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

I claim:

1. A method of determining a code rate for a block of memory space in a non-volatile solid-state memory device, the method comprising:
   determining whether a marginal condition exists for at least a portion of a block of data of the non-volatile solid-state memory device;
   encoding data corresponding to the block;
   puncturing the encoded data by a particular amount; and
   decreasing a code rate used with the block if the marginal condition exists, wherein decreasing the code rate comprises reducing the particular amount of puncturing in the encoded data.

2. The method of claim 1, wherein the decreased code rate is in a range of 1/3 to 1/2.

3. The method of claim 1, wherein encoding the data comprises convolutionally encoding the data.

4. The method of claim 1, wherein the encoded data corresponds to a convolutional code with an initial code rate of 1/4.

5. The method of claim 1, further comprising storing reference information in one or more memory arrays, wherein the reference information indicates the used code rate.

6. The method of claim 1, wherein the non-volatile solid-state memory device corresponds to a NAND flash memory device.

7. An apparatus comprising:
   one or more memory arrays of a non-volatile memory device; and
   a memory controller configured to:
      determine whether a marginal condition exists for at least a portion of a block of data of the memory device;
      encode data corresponding to the block;
      puncture the encoded data by a particular amount; and
      decrease a code rate used with the block if the marginal condition exists by reducing the particular amount of puncturing in the encoded data.

8. The apparatus of claim 7, wherein the decreased code rate is in a range of 1/3 to 1/2.

9. The apparatus of claim 7, wherein the encoded data is convolutionally encoded.

10. The apparatus of claim 7, wherein the encoded data corresponds to a convolutional code with an initial code rate of 1/4.

11. The apparatus of claim 7, wherein the memory controller is configured to store reference information in the one or more memory arrays, wherein the reference information indicates the code rate.

12. The apparatus of claim 7, wherein the non-volatile memory device corresponds to a NAND flash memory device.

13. A computer system comprising:
   one or more processors; and
   a memory device comprising:
      one or more memory arrays of a non-volatile memory device; and
      a memory controller configured to:
         determine whether a marginal condition exists for at least a portion of a block of data of the memory device;
         encode data corresponding to the block;
         puncture the encoded data by a particular amount; and
         decrease a code rate used with the block if the marginal condition exists by reducing the particular amount of puncturing in the encoded data.

14. The computer system of claim 13, wherein the decreased code rate is in a range of 1/3 to 1/2.

15. The computer system of claim 13, wherein the encoded data is convolutionally encoded.

16. The computer system of claim 13, wherein the encoded data corresponds to a convolutional code with a code rate of 1/4.

17. The computer system of claim 13, wherein the memory controller is configured to store reference information in the one or more memory arrays, wherein the reference information indicates the code rate.

* * * * *